United States Patent
Brown et al.

(10) Patent No.: US 7,252,737 B2
(45) Date of Patent: *Aug. 7, 2007

(54) PEDESTAL WITH INTEGRAL SHIELD

(75) Inventors: Karl Brown, San Jose, CA (US);
Vineet Mehta, San Jose, CA (US);
See-Eng Phan, San Jose, CA (US);
Semyon Sherstinsky, San Francisco, CA (US); Allen Lau, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 328 days.

This patent is subject to a terminal disclaimer.

(21) Appl. No.: 10/819,891

(22) Filed: Apr. 6, 2004

(65) Prior Publication Data
US 2005/0056370 A1 Mar. 17, 2005

Related U.S. Application Data

(60) Division of application No. 10/128,983, filed on Apr. 24, 2002, now Pat. No. 6,726,805, which is a continuation of application No. 09/927,747, filed on Aug. 9, 2001, now Pat. No. 6,652,713.

(51) Int. Cl.
*C23C 16/00* (2006.01)
*C23F 1/00* (2006.01)
*H01L 21/306* (2006.01)

(52) U.S. Cl. ............... 156/345.51; 118/728; 118/729; 118/730; 156/345.52; 156/345.53; 156/345.54; 156/345.55

(58) Field of Classification Search ............... 118/728; 156/345.51
See application file for complete search history.

(56) References Cited

U.S. PATENT DOCUMENTS

| 3,661,758 | A |   | 5/1972  | Jackson et al.           |
|-----------|---|---|---------|--------------------------|
| 5,538,758 | A | * | 7/1996  | Beach et al. ... 427/255.6 |
| 5,584,936 | A | * | 12/1996 | Pickering et al. ... 118/728 |
| 5,676,758 | A | * | 10/1997 | Hasegawa et al. ... 118/723 E |
| 5,804,046 | A |   | 9/1998  | Sawada et al.            |
| 6,039,836 | A | * | 3/2000  | Dhindsa et al. ... 156/345.1 |
| 6,077,353 | A | * | 6/2000  | Al-Sharif et al. ... 118/500 |
| 6,090,212 | A | * | 7/2000  | Mahawili ... 118/728     |
| 6,107,192 | A |   | 8/2000  | Subrahmanyan et al.      |

(Continued)

FOREIGN PATENT DOCUMENTS

EP 1167573 A1 * 1/2002

*Primary Examiner*—Parviz Hassanzadeh
*Assistant Examiner*—Rakesh Dhingra
(74) *Attorney, Agent, or Firm*—Patterson & Sheridan, LLP (57) ABSTRACT

Generally, a substrate support member for supporting a substrate is provided. In one embodiment, a substrate support member for supporting a substrate includes a body coupled to a lower shield. The body has an upper surface adapted to support the substrate and a lower surface. The lower shield has a center portion and a lip. The lip is disposed radially outward of the body and projects towards a plane defined by the first surface. The lip is disposed in a spaced-apart relation from the body. The lower shield is adapted to interface with an upper shield disposed in a processing chamber to define a labyrinth gap that substantially prevents plasma from migrating below the member. The lower shield, in another embodiment, provides the plasma with a short RF ground return path.

10 Claims, 7 Drawing Sheets

U.S. PATENT DOCUMENTS

| | | |
|---|---|---|
| 6,171,453 B1 | 1/2001 | Chung et al. |
| 6,221,221 B1 | 4/2001 | Al-Shaikh et al. |
| 6,264,812 B1 | 7/2001 | Raaijmakers et al. |
| 6,494,955 B1* | 12/2002 | Lei et al. .................... 118/715 |
| 6,932,871 B2* | 8/2005 | Chang et al. ................ 118/719 |
| 2002/0069820 A1 | 6/2002 | Yudovsky |
| 2002/0075027 A1* | 6/2002 | Hollman et al. ............ 324/765 |
| 2003/0173230 A1* | 9/2003 | Wadensweiler et al. .... 205/672 |

* cited by examiner

PEDESTAL WITH INTEGRAL SHIELD

CROSS-REFERENCE TO RELATED APPLICATIONS

This application is a divisional of U.S. patent application Ser. No. 10/128,983, filed Apr. 24, 2002, now U.S. Pat. No. 6,726,805 which is a continuation in part of U.S. patent application Ser. No. 09/927,747, filed Aug. 9, 2001, now U.S. Pat. No. 6,652,713. Each of the aforementioned related patent applications is herein incorporated by reference.

BACKGROUND OF THE INVENTION

1. Field of the Invention

Embodiments of the invention generally relate to a pedestal having a shield for supporting a substrate in a semiconductor processing chamber.

2. Description of the Related Art

In semiconductor substrate processing, the trend towards increasingly smaller feature sizes and linewidths has placed a premium on the ability to mask, etch, and deposit material on a semiconductor workpiece, or substrate, with greater precision. Plasma etching is of particular importance in obtaining critical dimensions less than 0.25 micron.

Typically, etching is accomplished by applying RF power to a working gas supplied to a low pressure processing region over a substrate supported by a support member. The resulting electric field creates a reaction zone in the processing region that excites the working gas into a plasma. The support member is biased to attract ions within the plasma towards the substrate supported thereon. Ions migrate towards a boundary of the plasma adjacent the substrate and accelerate upon leaving the boundary layer. The accelerated ions produce the energy required to remove, or etch, the material from the surface of the substrate. As the accelerated ions can etch other items within the processing chamber, it is important that the plasma be confined to the processing region above the substrate.

Figure 1:
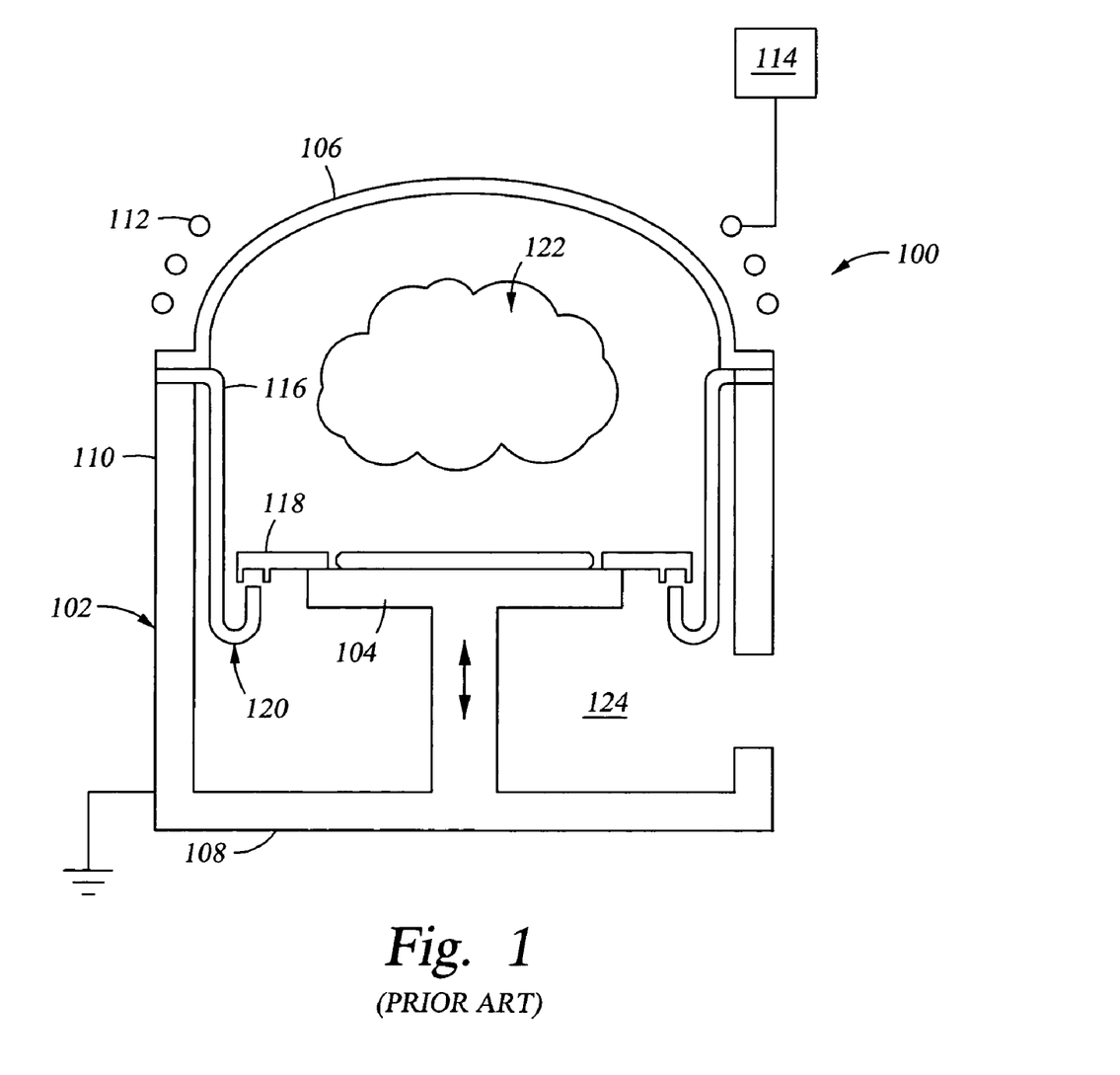
FIG. 1 is a sectional view of an illustrative processing chamber of the prior art.

FIG. 1 illustrates an exemplary processing chamber 100 that provides for plasma confinement. The processing chamber 100 includes a chamber body 102 having a vertically movable substrate support member 104 disposed therein. The support member 104 generally includes one or more electrodes for biasing the substrate. The chamber body 102 generally includes a lid 106, a bottom 108 and sidewall 110. Coils 112 are disposed proximate the lid 106 and are coupled to a power source 114. An annular shield 116 is coupled to the sidewalls 110 or lid 106 and circumscribes the support member 104. A cover ring 118 is suspended from a J-section 120 of the shield 116 when the support member 104 is in a lowered position.

As the support member 104 is elevated to a processing position as depicted in FIG. 1, the perimeter of the support member contacts the cover ring 118, lifting the cover ring 118 off the shield 116. Since the cover ring 118 and J-section 120 of the shield 116 remain interleaved creating a labyrinth or gap, plasma formed in a process region 122 defined between the support member 104 and the lid 106 does not migrate to a region 124 below the support member 104 where ions leaving the plasma may etch chamber components proximate thereto.

Although utilization of a cover ring lifted by a support member has been successfully commercialized, the use of cover rings in processing chambers utilizing ceramic support members is generally not preferred. Generally, each time the ceramic support member is raised to the processing position, the cover ring impacts the ceramic support member. The repeated impact of the cover ring with a ceramic support member over the course of processing a number of substrates is undesirable due to the brittle nature of ceramic. The ceramic support member is often damaged after repeated impact and may chip, break or generate particles. This leads to premature replacement of the ceramic support member and causes poor processing and increased defect rates.

Therefore, there is a need for an improved method and apparatus for supporting a substrate on a ceramic support member in a processing chamber.

SUMMARY OF THE INVENTION

In one aspect of the invention, a lower shield adapted to be coupled to a substrate support member is provided. In one embodiment, the lower shield includes a center portion and a lip extending from the perimeter. The center portion includes an aperture having a groove disposed in a sidewall of the aperture. The lip is adapted to interface with an upper shield disposed in a processing chamber to form a labyrinth gap that prevents plasma from migrating below the lower shield.

In another aspect of the invention, a support member for supporting a substrate is provided. In one embodiment, a support member for supporting a substrate includes a body coupled to a lower shield. The body has an upper surface and a lower surface. The upper surface is adapted to support the substrate. The lower shield has a center portion and a lip. The lip is disposed radially outward of the body and projects upwardly towards a plane defined by the upper surface. The lip is disposed in a spaced-apart relation from the body. The lower shield prevents plasma from migrating below the support member. The lower shield, in one embodiment, provides a portion of an RF ground return path within a processing chamber.

In another aspect of the invention, a processing chamber for processing a substrate is provided. In one embodiment, the processing chamber includes a chamber body having an annular upper shield and support member disposed therein. The chamber body has a bottom, walls and lid that define an interior volume. The upper shield is disposed below the lid in the interior volume. The support member is disposed in the interior volume and has a body coupled to a lower shield. The body has an upper surface and a lower surface. The upper surface is adapted to support the substrate. The lower shield has a center portion and a lip. The lip is disposed radially outward of the body and projects upwardly towards a plane defined by the first surface. The lip is disposed in a spaced-apart relation from the body. The lip and upper shield substantially prevent plasma from migrating below the support member.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION

Generally, an apparatus and method for supporting a substrate on a ceramic pedestal in a processing chamber is provided. In another aspect of the invention, an apparatus and method for providing a direct RF return path is provided. Although the invention is described with reference to one embodiment of pre-clean chamber, the invention finds utility in other chambers that utilize a ceramic substrate support pedestal or where a direct RF return is desired.

Figure 2:
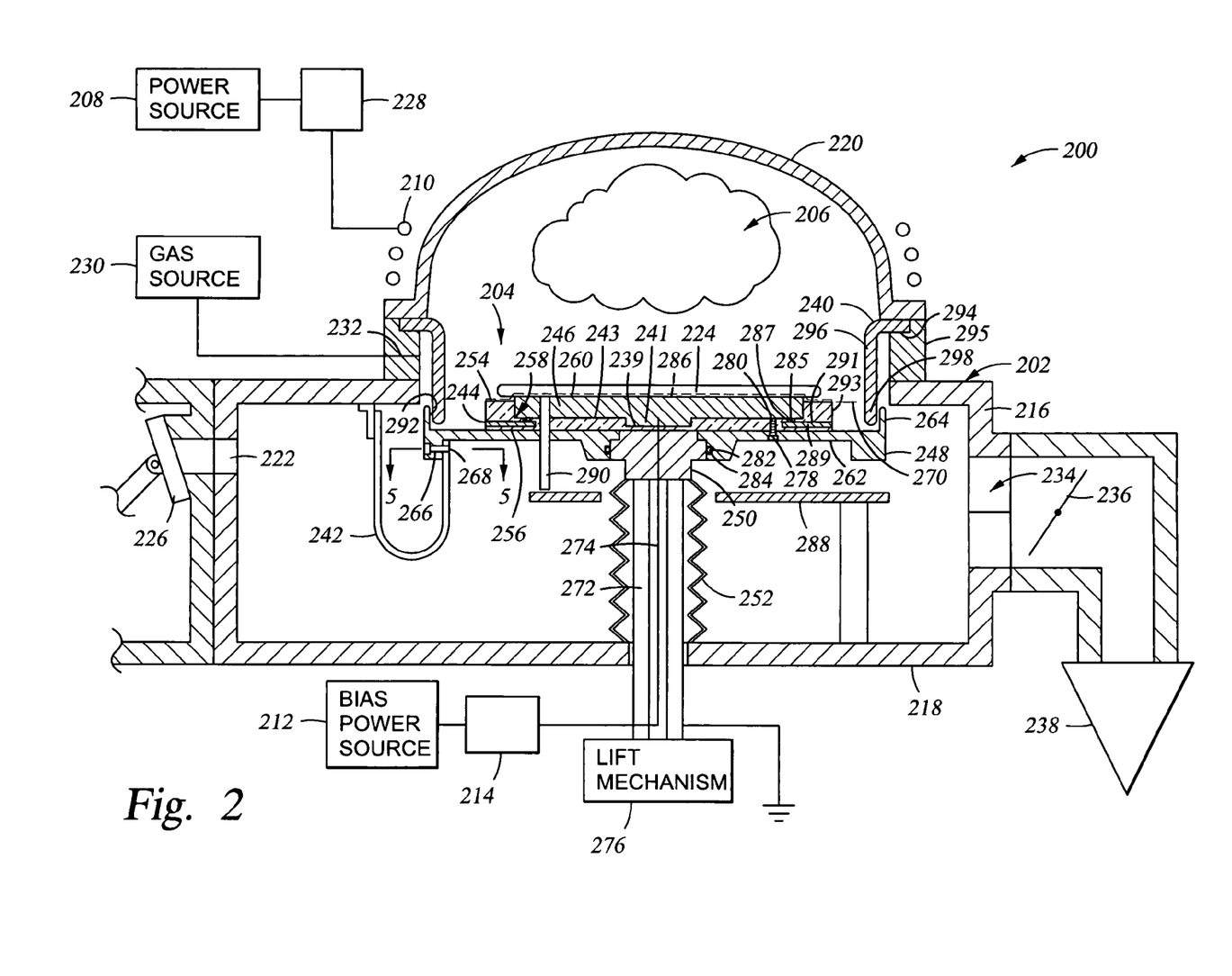
FIG. 2 is a sectional view of one embodiment of a processing chamber having a lower shield coupled to a support member disposed in a processing position.

FIG. 2 depicts a cross sectional view of one embodiment of a sputter etch chamber 200. The chamber 200 is a dual frequency etch processing chamber such as a Pre-Clean XT Chamber available from Applied Materials, Inc., located in Santa Clara, Calif. However, other processing chambers may also benefit from the invention. Generally, the chamber 200 comprises a chamber body 202, a substrate support member 204 disposed within a processing region 206 of the chamber 200, an RF power source 208 connected through a matching circuit 228 to an inductive coil 210 disposed outside the chamber body 202 and a power source 212 connected to the substrate support member 204 through a matching circuit 214.

The chamber body 202 includes sidewalls 216, a bottom 218 and a lid 220. An access port 222 is generally disposed in the sidewalls 216 to allow entry and egress of the substrate 224 from the chamber 200. The port 222 is selectively sealed by a slit valve 226 to isolate the processing region 206 during processing. A transfer robot (not shown) is utilized to pass the substrate through the port 222 to place and retrieve the substrate 224 from the substrate support member 204. One slit valve that may be used to advantage is described in U.S. Pat. No. 5,226,632, issued Jul. 13, 1993 to Tepman, et al., which is hereby incorporated by reference in its entirety.

In one embodiment, the lid 220 is a quartz dome disposed on an adapter 295 that is coupled to the sidewalls 216 above the processing region 206. The inductive coil 210 is generally disposed around the lid 220 and connected through a matching circuit 228 to the RF power source 208. The RF power source 208 inductively couples power to a plasma formed from a working gas supplied to the processing region 206 during processing. The coil 210 may be vertically stacked about the lid 220 as shown in FIG. 2, disposed equidistant from the dome or arranged in other configurations.

A gas source 230 is coupled to a gas inlet 232 disposed through the adapter 295 to introduce process gas(es) into the processing region 206 of chamber 200 during processing. A gas exhaust 234 in fluid communication with the processing region 206 evacuates the chamber 200 prior to and during processing. A throttle valve 236 and a vacuum pump 238 coupled to the exhaust port 234 maintain a predetermined pressure within the processing region 206 of the chamber 200 during processing.

An annular inner shield 240 is generally disposed within the chamber body 202 and circumscribes the processing region 206. The inner shield 240 is generally coupled to the lid 220 or sidewalls 216. The inner shield 240 maybe replaceable as part of a "process kit" that is replaced after a number of substrates have been processed. The inner shield 240 is generally comprised or coated with a conductive material. In one embodiment, the inner shield 240 is fabricated from aluminum and is electrically coupled to the sidewalls 216 at a first end 294 and extends radially inward and downward, terminating at a second end 298.

A conductive flexible strap 242 electrically couples the inner shield 240 and the substrate support member 204. The conductive strap 242 is generally comprised of a conductive and durable material. In one embodiment, the strap 242 is comprised of beryllium-copper. Other flexible, conductive materials may also be utilized. The strap 242 is configured to allow the substrate support member 204 to move vertically within the chamber 200.

Figure 7:
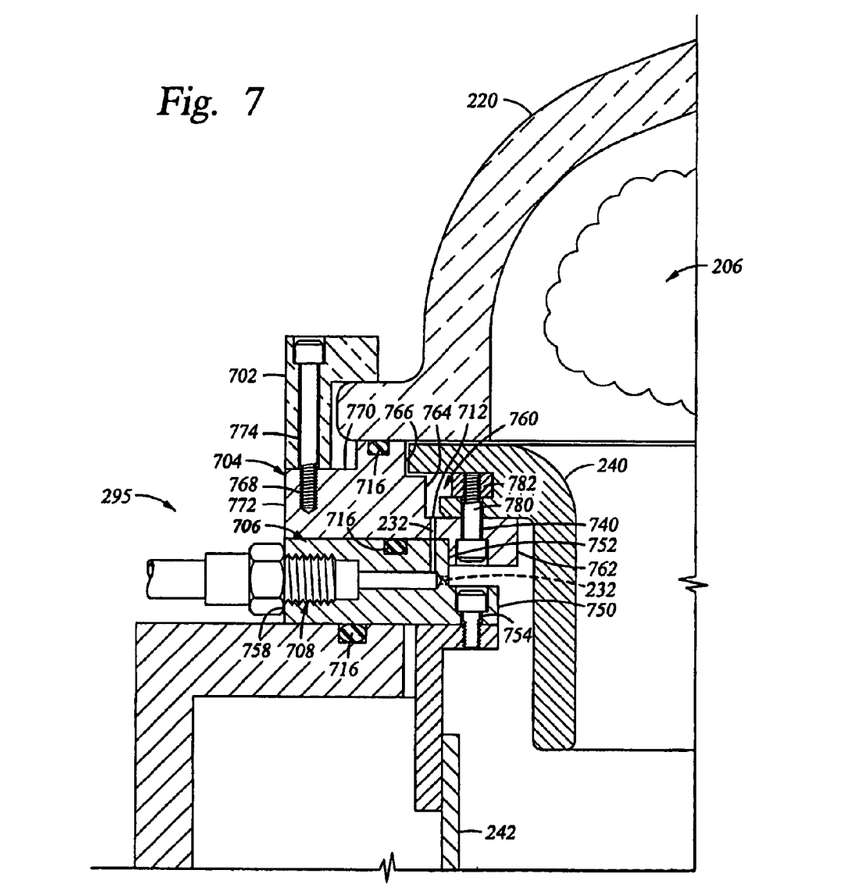
FIG. 7 is a partial sectional view of a chamber lid and sidewall interface of the processing chamber of FIG. 2.

FIG. 7 is a partial sectional view of the chamber lid 220, adapter 295 and inner shield 240 of the processing chamber 200 of FIG. 2. The adapter 295 is generally disposed between the sidewall 216 and the lid 220. The adapter 295 is typically fabricated from a conductive material, for example, aluminum. In one embodiment, the adapter 295 has an upper portion 704 and a lower portion 706. The lower portion 706 is annular in form and includes a flange 750 extending inward from an inner surface 752 of the lower portion 706. The flange 750 includes a plurality of mounting holes 754 formed therein to facilitate coupling the ground strap 242 to the adapter 295. A port 708 is disposed in an outer surface 758 of the lower portion 706 to facilitate coupling the inlet 232 to the gas source 230.

Preferably, the inlet 232 is at least partially routed through a plenum 760 defined between the adapter 295 and the inner shield 240, then routed between the inner shield 240 and the lid 220 into the processing region 206. This preferred route of the inlet 232 through the plenum 760 and around the inner shield 240 enhances the uniform distribution of process gases into the processing region 206. Alternatively, the inlet 232 may be routed directly through the lower portion 706 into the processing region 206. The lower portion 706 is typically coupled to the sidewalls 216 of the chamber body 202 by fasteners (not shown).

The upper portion 704 of the adapter 295 is also annular in form and includes an inner flange 762 extending from an inner surface 764. The inner flange 762 includes a plurality of holes 740 utilized to couple the inner shield 240 to the adapter 295. In one embodiment, the inner shield 240 is secured to the adapter 295 by a plurality of fasteners 780 that pass through the holes 740 formed in the inner flange 762 and thread into a threaded clamp member 782 to urge the inner shield 240 against the adapter 295 when the fasteners 780 are tightened.

A channel 712 is formed through the inner flange 762 to fluidly couple the port 708 to the plenum 760 formed between the adapter 295 and the inner shield 240. The inner surface 764 of the upper portion 704 includes a notch 766. The notch 766 serves to locate the inner shield 240 to the adapter 295, and forms an annular orifice to ensure uniform gas distribution in the plenum 760 disposed adjacent thereto.

A plurality of mounting holes 768 are formed in a top surface 770 of the upper portion 704 adjacent an outer surface 772 of the adapter 295. The mounting holes 768 accept a plurality of fasteners 774 utilized to urge a lid clamp 702 against the upper portion 704 to secured the lid 220 to the adapter 295.

Seals 716 are respectively disposed between the lid 220 and the upper portion 704; the upper portion 704 and the lower portion 706; and the lower portion 706 and the sidewall 216 to prevent fluid leakage between the processing region 206 and the environment outside the chamber 200. The seals 716 are fabricated from a material compatible with process chemistries. In one embodiment, the seals 716 are fabricated from CHEMREZ®.

Figures 8, 9, 10:
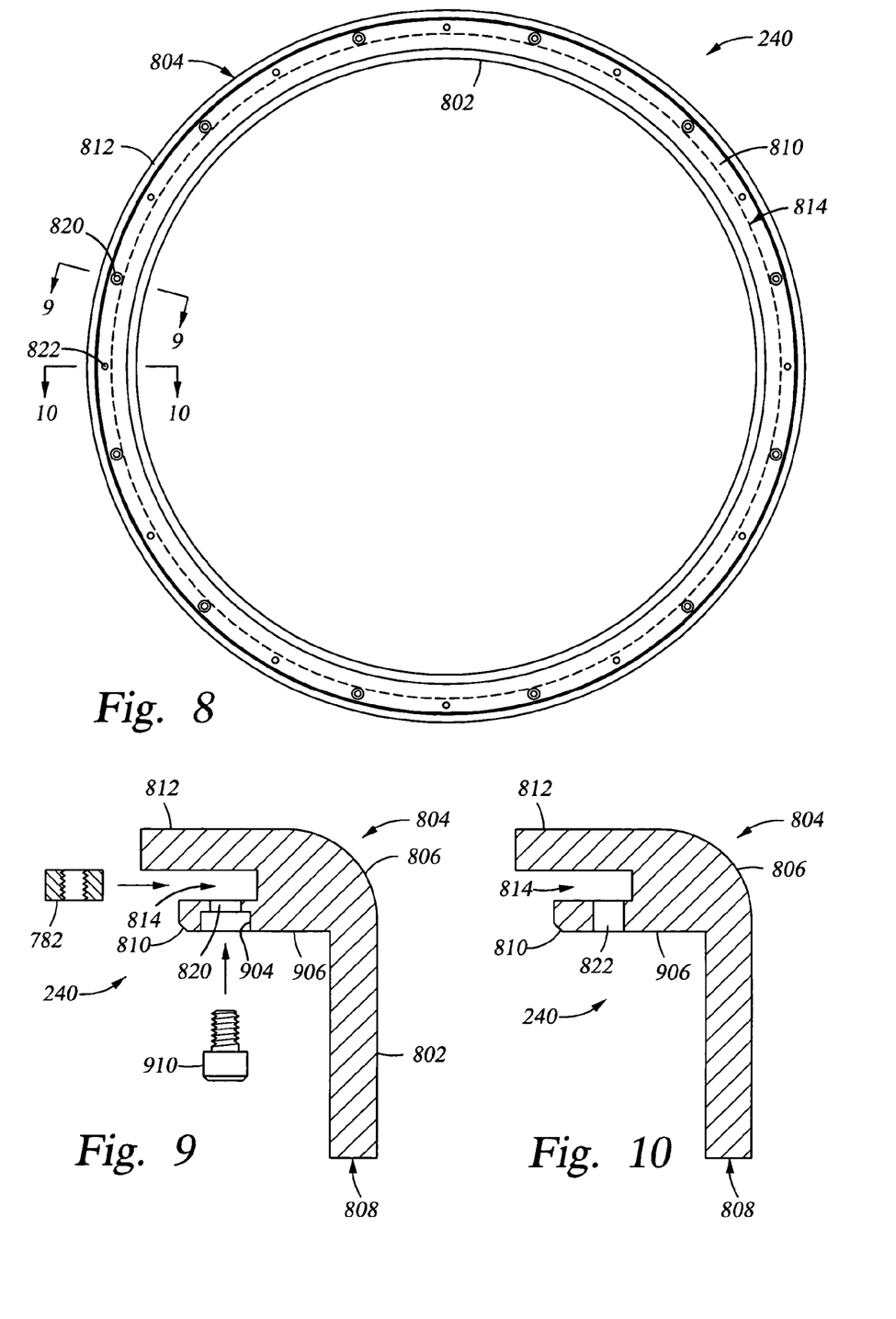
FIG. 8 is a plan view of one embodiment of an inner shield.
FIG. 9 is a sectional view of the inner shield of FIG. 8 taken along section line 9-9.
FIG. 10 is a sectional view of the inner shield of FIG. 8 taken along section line 10-10.

FIGS. 8, 9 and 10 depict plan and sectional views of one embodiment of inner shield 240. The inner shield 240 includes a cylindrical body 802 having a mounting ring 804 extending outwardly from the first end 806. The cylindrical body 802 ends at a second end 808 that is defined in column with the cylindrical body 802.

The mounting ring 804 includes a first flange 810 and a second flange 812 extending outwards from the cylindrically body 802 in a parallel, spaced apart relation. The first flange 810 is disposed closer to the second end 808 of the cylindrical body 802 then the second flange 812. The flanges 810, 812 define an annular slot 814 that is adapted to receive the clamp member 782 (seen in phantom in FIG. 8).

The first flange 810 includes at least a plurality of first mounting holes 820 adapted to secure the clamp member 782 in the slot 814. The first mounting holes 820 typically include a counter sink or counter bore 904 to allow the head of a fastener 910 to recess below an outer surface 906 of the first flange 810 opposite the slot 814. A plurality of second mounting holes 822 are also formed through the first flange 810. Typically, one of the second mounting holes 822 is disposed between each pair of first mounting holes 820. Each second mounting hole 822 facilitates passage of the fasteners 782 between the adapter 295 and threaded clamp member 782 (as seen in FIG. 7).

The second flange 812 is disposed at the first end 806 of the cylindrical body 802. The second flange 812 projects radially beyond the first flange 810 and is adapted to interface with the notch 766. The spaced apart relation of the flanges 810, 812 and the shorter first flange 810 provide enough volume for the plenum 760 that ensures uniform radial gas delivery into the processing region 206, thereby enhancing substrate processing.

Figure 11:
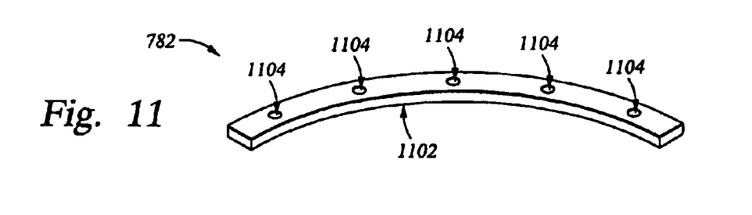
FIG. 11 is a partial perspective view of one embodiment of a threaded member for attaching an inner shield to a processing chamber.

FIG. 11 depicts one embodiment of the threaded clamp member 782. The threaded clamp member 782 facilitates coupling the inner shield 240 to the adapter 295. The threaded clamp member 782 is typically comprises of a high strength material compatible with the processing environment such as titanium. The threaded clamp member 782 is configured to fit with the slot 814 defined between the flanges 810, 812 of the inner shield 240, and is typically comprised of a plurality of arc segments 1102 (one is shown in FIG. 11). Each arc segment 1102 includes a plurality of threaded holes 1104 formed therein to accept the fasteners 910 that secure the threaded clamp member 782 to the inner shield 240 and the fasteners 782 that secure the assembled threaded clamp member and inner shield assembly to the adapter 295. By utilizing the threaded clamp member 782 to secure the inner shield 240, thread forming and the use of inserts in the aluminum structure of the inner shield 240 is avoided, thereby eliminating the possibility of stripping aluminum threads or loosening of thread inserts after repeated high temperature exposure.

The substrate support member 204 is depicted in FIG. 2. In one embodiment, the substrate support member 204 comprises a body 244, an insert 246, a lower shield 248, a clamp plate 250, a bellows 252 and a shaft 272. The body 244 is generally annular in form and is typically comprised of a dielectric material, for example, ceramic or quartz. The body 244 generally comprises an outer diameter (outer surface) 293, an upper surface 254 and a lower surface 256. The upper surface 254 is orientated to face the lid 220.

The outer surface 293 of the body 244 includes a plurality of antenna holes 291 formed therein. The antenna holes 291 are radially oriented parallel to the upper surface 254 of the body 244. Each of the antenna holes 291 are adapted to receive a ceramic rod 289 that focuses the plasma above the substrate support member 204.

The upper surface 254 generally includes a recess 258 and retains at least a portion of the insert 246. The recess 258 includes plurality of spring receiving holes 287 formed between the recess 258 in the upper surface 254 and antenna holes 291. A spring member 285 is disposed in the hole 287 and is compressed between the insert 246 and the ceramic rod 289. The spring member 285 is typically a stainless steel compression spring, but may alternatively take other spring forms. The spring member 285 applies a lateral force against the ceramic rod 259 thereby retaining the rod 289 within the hole 291.

The insert 246 generally includes a top surface 260 that extends slightly higher than the upper surface 254 of the body 244 and supports the substrate 224 thereon. Optionally, the top surface 260 and/or the upper surface 254 may be coated or covered with a dielectric material 286. The insert 246 is connected by a conductor 274 disposed through the shaft 272 to the power source 212 that electrically biases the insert 246 during processing. The top surface 260 of the insert 246 generally extends above the upper surface 254 of the body 244 such that the peripheral portion of the substrate 224 extends above the upper surface 254 and forms a gap between the bottom of the substrate and the upper surface 254. Optionally, the substrate support member 204 may includes a temperature control device such as a heater or fluid conduit (not shown) to regulate the temperature of the substrate 224 during processing.

The insert 246 includes a lower surface 243 opposite the top surface 260 that includes a boss 241 extending therefrom. The boss 241 is received in a depression 239 centrally formed in the recess 258 of the body 244. The mating of the boss 241 and depression 239 accommodates the difference in rates of thermal expansion between the insert 246 and body 244 while maintaining concentricity therebetween.

The lower shield 248 is generally disposed between the body 244 and the bellows 252. The lower shield 248 extends radially outward from the body 244 and is comprised of or coated with an electrically conductive material such as aluminum. The lower shield 248 is electrically coupled to ground through the shaft 272. The lower shield 248 is replaceable. In one embodiment, the lower shield 248 is part of a "process kit" that is replaced after a number of substrates have been processed.

The lower shield 248 includes a center portion 262 that extends radially to a lip 264. The lip 264 is orientated upwards at an angle from center portion 262, projecting towards a plane 270 defined by the first surface 254 of the body 244. In one embodiment, the lip 264 is substantially perpendicular (i.e., within 15 degrees) to the center portion 262. In the embodiment depicted in FIG. 2, the lip 264 is perpendicular to the center portion 262 and parallel to the inner shield 240 and sidewalls 216. In the raised position, the lip 264 is interleaved outward of second end 298 of the inner shield 240 to form a labyrinth gap 292 that prevents the plasma from leaving the processing region 206.

The lip 264 is configured in a spaced-apart relation from the body 244. The lip 264 generally is positioned radially outward of the inner shield 240. In one embodiment, the lip 264 is of sufficient length to overlap the inner shield 240 when the substrate support member 204 is in the process position. The length of the lip 264 and the travel of the lift pin (not shown) should be configured to prevent interference with the removal of the substrate 224 from the substrate support member 204 when the member 204 is disposed in the lowered position depicted in FIG. 6.

Figure 6:
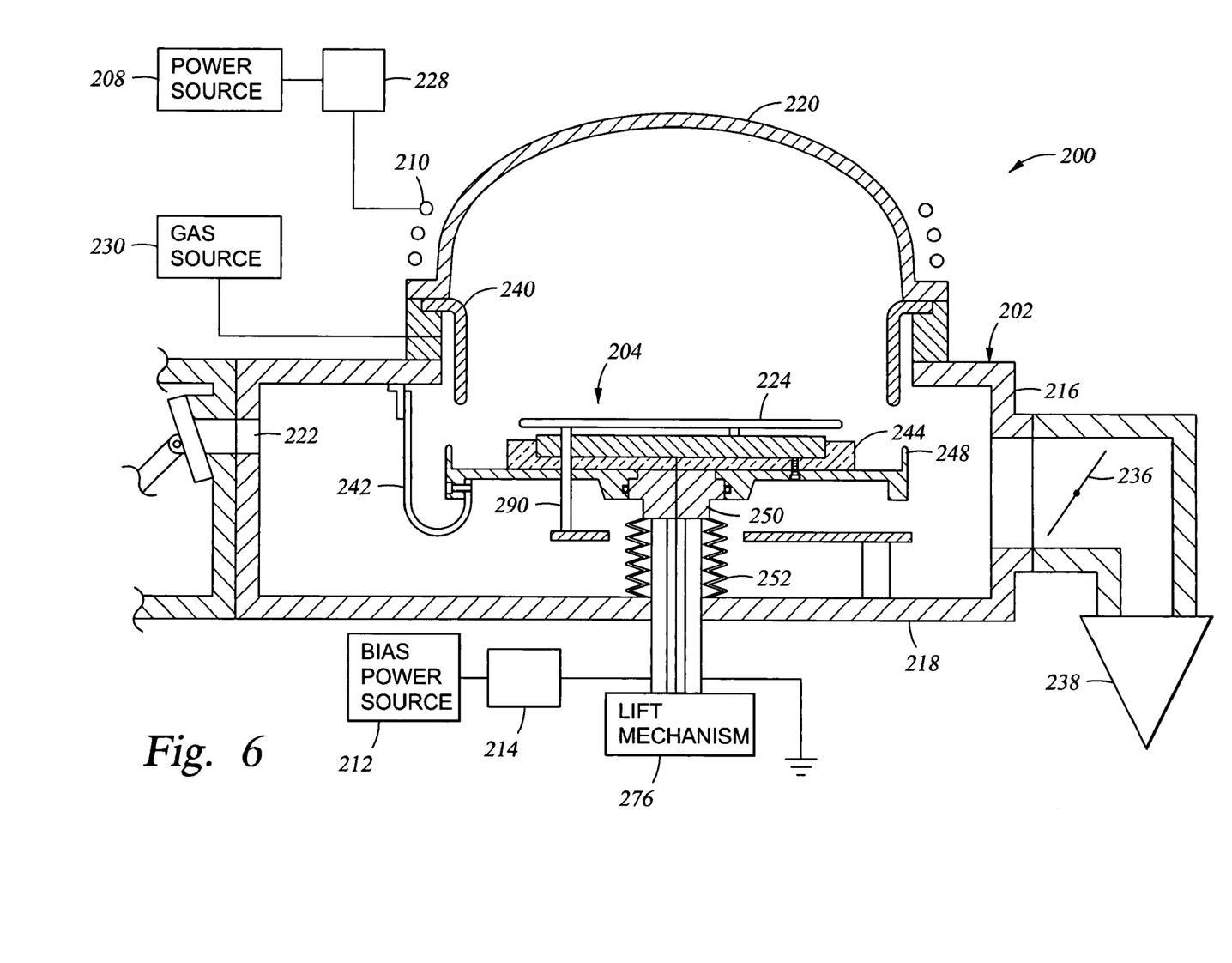
FIG. 6 is a sectional view of the chamber of FIG. 2 with the support member in a transfer position.

In the embodiment depicted in FIG. 2, the lower shield 248 is disposed between the lower surface 256 of the body 244 and the clamp plate 250 which is typically screwed or otherwise fastened to the body 244. The clamp plate 250 is coupled to the shaft 272 which allows a lift mechanism 276 positioned outside the chamber 200 to move the substrate support member 204 between the upper, processing position depicted in FIG. 2 and a lower position that facilitates substrate transfer as shown in FIG. 6. The clamp plate 250 is generally comprised of a RF conductive material such as aluminum and is typically coupled to the shaft 272 by welding, although other fastening methods may be utilized.

Generally, a plurality of fasteners 278 couple the lower shield 248 to the body 244. In one embodiment, the fasteners 278 pass through the lower shield 248 and thread into a threaded hole 280 disposed in the body 244. Alternatively, the lower shield 248 may be fastened to the clamp plate 250. Optionally, the lower shield 248 and the clamp plate 250 may be incorporated into a single member.

The lower shield 248 is electrically grounded through the pedestal 204 and shaft 272. To promote good electrical contact between the lower shield 248 and the shaft 272, a conductive member 282 may be disposed therebetween. The conductive member 282 may be a conductive grease, paste, adhesive, foil or other material that promotes electrical conduction between the lower shield 248 and clamp plate 250 which is electrically coupled to the shaft 272. Alternatively, the conductive member may be disposed between the lower shield 248 and the body 244. In the embodiment depicted in FIG. 2, the conductive member 282 comprises a spring that is formed from a conductive material such as beryllium copper that is partially disposed in a groove 284 formed in the lower shield 248. Alternatively, the groove 284 retaining the conductive member 282 may be disposed in the clamp plate 250 or disposed in both the clamp plate 250 and lower shield 248.

Figure 3:
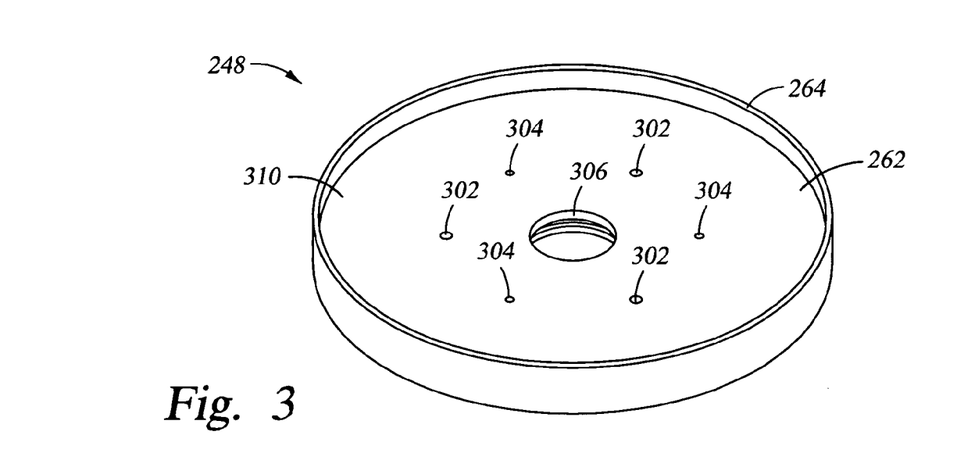
FIG. 3 is a top perspective view of the lower shield of FIG. 2.

FIG. 3 is a perspective view of one embodiment of the lower shield 248 depicting an upper surface 310. Generally, the lower shield 248 has a center aperture 306 that centers the lower shield 248 with the clamp plate 250. A plurality of lift pin holes 302 are disposed through the lower shield 248 which allow lift pins 290 ((shown in FIG. 2) to pass therethrough. A plurality of mounting holes 304 are generally disposed through the lower shield 248 to allow the fasteners 278 to interface with the body 244.

Figure 4:
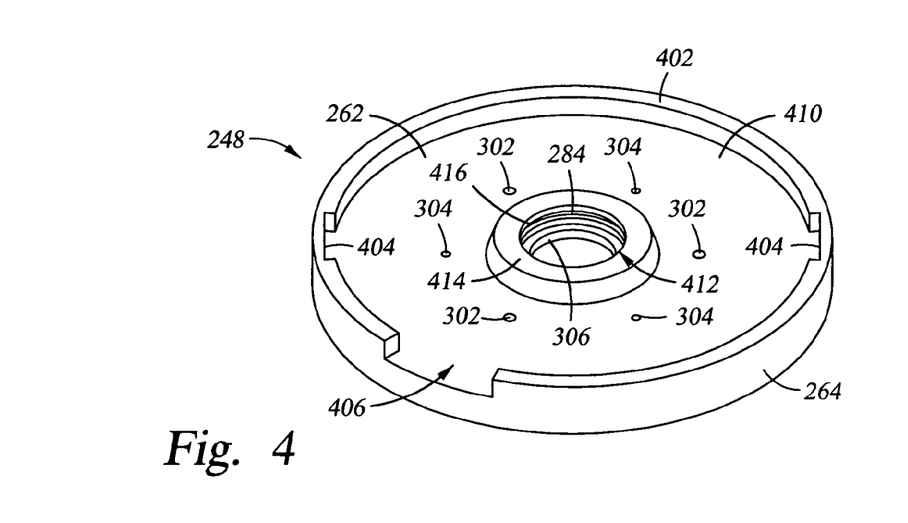
FIG. 4 is a bottom perspective view of the lower shield of FIG. 2.

FIG. 4 is a perspective of one embodiment of the lower shield 248 depicting a lower surface 410. The lower surface 410 generally has a mounting ring 402 extending from the lip 264 and a boss 414 extending from the center portion 262. The mounting ring 402 may include a notch 406 that allows a lift plate 288 (shown in FIG. 2) to move closer to the bottom surface 410 when actuating the lift pins 290. The mounting ring 402 also includes one or more mounting surfaces 404 orientated tangentially on the interior portion of the mounting ring 402.

Figure 5:
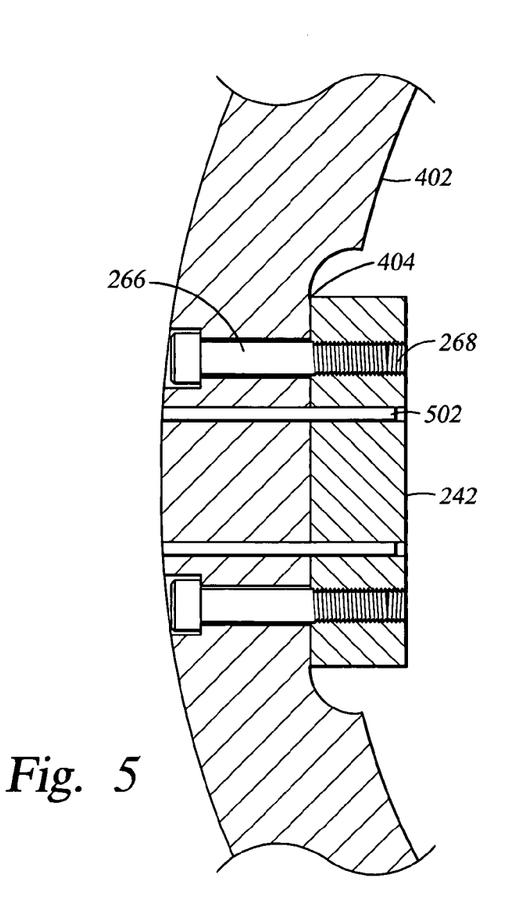
FIG. 5 is a partial sectional view of the shield of FIG. 2 taken along section line 5-5.

As seen in FIG. 5, the mounting surface 404 provides a flat interface for mounting the strap 242 to the lower shield 248. The flat interface provides good electrical conductivity and maintains the strap 242 in a flat configuration that promotes flexibility. Additionally, one or more locating elements such as a dowel pin 502 may be disposed between the strap 242 and lower shield 248 to facilitate attaching the strap 242 to the lower shield 248.

Returning to FIG. 4, the boss 414 includes a bore 412 disposed concentrically with the aperture 306. The groove 284 is disposed in the sidewall 416 of the aperture 306 or the bore 412. In the embodiment shown in FIG. 4, the aperture 306 is utilized to locate the lower shield 248 with the clamp plate 250 while the bore 412 is utilized to house the groove 284 that retains the conductive member 282.

Returning to FIG. 2, the bellows 252 is coupled between the lower shield 248 or clamp plate 250 and the chamber bottom 218. The bellows 252 provides a vacuum seal between substrate support member 204 and the chamber body 202 while allowing vertical movement of the member 204.

The conductive, flexible strap 242, which electrically couples the upper shield 254 and the lower shield 248, provides a short RF return path for the plasma disposed in the processing region 206 which electrically contacts the upper shield 254. Plasma contacting the upper shield 254, is grounded through a path comprising the strap 242, lower shield 248, conductive member 282, clamp blade 250 and shaft 272. A short RF return advantageously minimizes voltage accumulation on the chamber walls and the reduces voltage drop of the return path over most conventional processing chambers that rely on the walls and bellows to provide the return path from the plasma to ground shaft 272.

In one embodiment, a fastener 266 passes through the lower shield 248 and mates with a threaded hole 268 disposed in the strap 242 thereby electrically coupling the strap 242 and the lower shield 248. The strap 242 may be electrically coupled to the lower shield 248 by other devices such as conductive adhesives, rivets, clamping, staking, mating terminals or other conductive connecting devices.

In operation, a substrate 224 is disposed on the support member 204 while in the lower position depicted in FIG. 6. The lift mechanism 276 raises the support member 204 and substrate 224 into the processing position depicted in FIG. 2. In the processing position, the inner shield 240 and lower shield 248 interleave, forming the labyrinth gap 292 therebetween.

A working gas such as argon is introduced through the gas inlet 232 into the processing region 206. The working gas may alternatively comprise helium, argon, nitrogen and other non-reactive gases. Optionally, the working gas may additionally comprise a reactive component such as hydrogen, oxygen or fluoride comprising gases.

To activate the reaction, a plasma is formed from the working gas in the processing region 206 through inductive coupling and/or capacitive coupling. The initial plasma is preferably struck by biasing the substrate support member 204 between about 1 W and about 200 W and between about 100 KHz and about 100 MHz for about 3 seconds. Alternatively, the initial plasma is generated by applying power to the inductive coil 210 or by other ignition methods or devices.

During the reaction period, the inductive coil 210 is biased between about 1 W and about 1000 W at between about 100 KHz and about 60 MHz while the substrate support member 204 is biased between about 0 W and about 200 W. Alternatively, during the reaction period, the plasma in the processing region 206 is sustained solely by the inductive coil 210. Alternatively, the plasma within the processing region 206 may be excited and sustained during processing by inductive coupling only, capacitive coupling only or combinations of both inductive and capacitive coupling.

During processing, the chamber pressure is preferably maintained between about 0.5 mTorr and about 100 mTorr by controlling the open/closed state of the throttle valve 236. Optionally, the temperature of the substrate 224 during processing is controlled by a temperature control device (not shown) within the substrate support member 204.

The plasma is prevented from migrating from the processing region 206 by the labyrinth gap 292 formed between the upper and lower shields 240 and 248. Additionally, the short RF return path through the lower shield 248 enhances the efficiency of the chamber 200.

Figure 12:
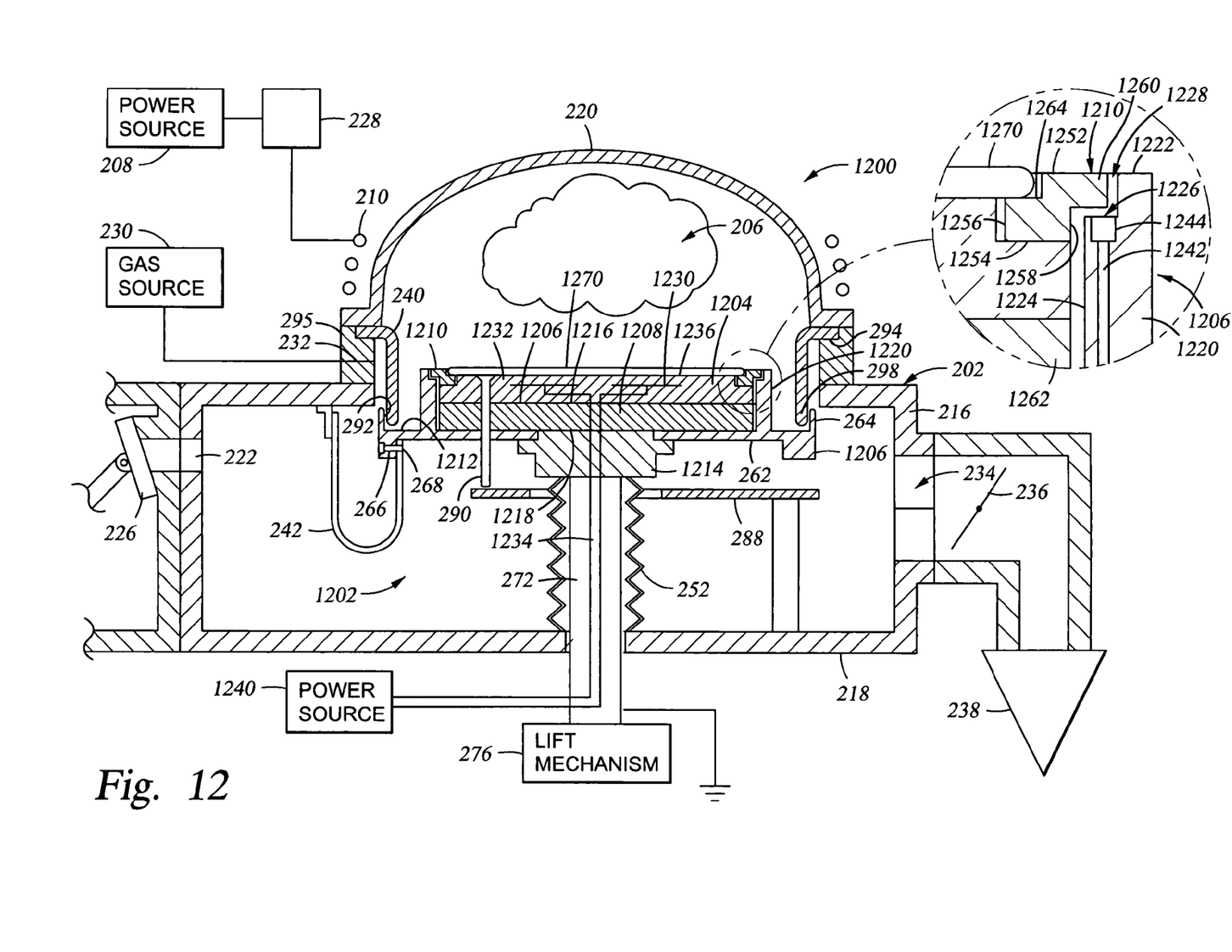
FIG. 12 is sectional view of another embodiment of a processing chamber having a lower shield coupled to a support member disposed in a processing position.

FIG. 12 depicts another embodiment of an exemplary processing chamber 1200 that provides for plasma confinement. The processing chamber 1200 is essentially the same as the chamber 200 described with reference to FIG. 2, except that a substrate support member 1202 disposed therein includes an electrostatic chuck (ESC) 1204 having a lower shield 1206 coupled thereto.

The substrate support member 1202 includes a body 1208 that supports the ESC 1204 thereon, a cover ring 1210, the lower shield 1206, a clamp plate 1214, a bellows 252 and a shaft 272. The body 1208 is generally annular in form and is typically comprised of a structural material, for example, stainless steel, aluminum, ceramic, quartz and the like. The body 1208 generally comprises an upper surface 1216 and a lower surface 1218. The upper surface 1216 is orientated to face a lid 220 of the chamber 1200. The upper surface 1216 generally supports the ESC 1204 therein. The lower surface 1218 is generally coupled to the shaft 272 and is sealed to a chamber body 202 of the processing chamber 1200 by the bellows 252.

The ESC 1204 includes one or more electrodes 1230 disposed in a dielectric body 1232. The electrodes 1230 are coupled to a power source 1240 by leads 1234 routed through the body 1208 and shaft 272. The ESC 1204 may be any electrostatic chucking device for securing the substrate to the substrate support member 1202 while processing. In the embodiment depicted in FIG. 12, the ESC 1204 is has a ceramic body 1232 that includes a raised, substrate supporting center portion 1236 and a circumscribing flange 1238. The flange 1238 is adapted to support the cover ring 1210 thereon.

The lower shield 1206 is coupled to the lower surface 1218 of the body 1208 by the clamp plate 1214. The lower shield 1206 is generally similar to the lower shield 240 described above except that the lower shield 1206 includes an inner ring 1220 projecting concentrically to a central axis of the lower shield 1206. The inner ring 1220 circumscribes the ESC 1204 and locates the cover ring 1210 concentrically to the substrate support member 1202.

The lower shield 1206 is generally disposed between the body 1208 and the bellows 252. The lower shield 1206 extends radially outward from the body 1208 and is comprised or coated with an electrically conductive material such as aluminum. The lower shield 1206 is electrically coupled to ground through the shaft 272.

The lower shield 1206 includes a top surface 1212 that extends radially to a lip 264. The lip 264 is orientated upwards at an angle from top surface 1212. In one embodiment, the lip 264 is substantially perpendicular (i.e., within 15 degrees) to the top surface 1212. In the raised position, the lip 264 is interleaved outward of the inner shield 240 to form a labyrinth gap 292 that prevents the plasma from leaving a processing region 206 defined between the substrate support member 1202 and the lid 220.

The inner ring 1220 extends from the top surface 1212 of the substrate support member 1202 and is concentric with the lip 264. The inner ring 1220 includes an upper surface 1222 disposed opposite the top surface 1212 and an inner surface 1224 forming the radially interior wall of the inner ring 1220. The upper surface 1222 includes an annular depression 1228 that has a bottom surface 1226. The bottom surface 1226 intersects the inner surface 1224 to provide a receiving pocket for the cover ring 1210.

A plurality of holes 1242 (only one is shown in the enlarged detail of FIG. 2) are formed through the lower shield 1206 and have a counter bore 1244 formed in the bottom surface 1226. The counter bore 1244 receives the head of a fastener (not shown) utilized to coupled the lower shield 1206 to the body 1208 (or clamp plate 1214).

The cover ring 1210 is generally annular in form and is typically fabricated from a dielectric material, such as quartz, alumina, other ceramics or plastics. The cover ring 1210 includes a top surface 1252, an opposed bottom surface 1254, a radially inner surface 1256 and an outer radially surface 1258. The radially outer surface 1258 includes a flange 1260 that extends outwardly along the top surface 1252 of the cover ring 1210. The flange 1260 and top surface 1252 define a cut-out 1262 that interleaves or mates with the annular depression 1228 formed in the lower shield 1206 to prevent deposition or etching of the ESC 1204 or body 1208.

The cover ring 1210 also includes a depression 1264 formed in the top surface 1252 proximate the inner surface 1256. The depth of the depression 1264 and thickness of the ring 1210 are configured to allow a substrate 1270, supported on the center portion 1236 of the ESC 1204 to partially extend over the depression 1264 without the substrate touching the cover ring 1210. The depression 1264 is configured to accommodate a predefined amount of misalignment between the substrate and the ESC 1204.

While the foregoing is directed to the preferred embodiment of the present invention, other and further embodiments of the invention may be devised without departing from the basic scope thereof. For example, native oxides and other contaminants may be removed from layers other than copper. The scope of the invention is determined by the claims that follow.

What is claimed is:

1. A substrate support member for supporting a semiconductor substrate during processing, comprising:
   a quartz body having:
   an upper surface and a lower surface;
   a stepped recess centrally formed in the upper surface having an outer portion and an inner portion;

at least one threaded hole formed between the upper and lower surface of the quartz body, the hole having an outlet in the inner portion of the stepped recess; and a plurality of lift pin holes disposed through the quartz body and exiting the upper surface through the inner portion of the stepped recess; and a plurality of ceramic rods extending radially inward from an outer diameter surface of the quartz body, wherein the quartz body further has a plurality of holes, for insertion of the plurality of ceramic rods, formed radially inward from the outer diameter surface of the quartz body.

2. The substrate support member of claim 1, wherein at least one of the holes formed radially inward from the outer diameter surface extends below the outer diameter of the stepped recess.

3. The substrate support member of claim 2, wherein the quartz body further has at least one spring receiving hole formed through the quartz body coupling the at least one of the holes formed radially inward from the outer diameter surface and the stepped recess.

4. The substrate support member of claim 1 wherein three holes are formed radially inward from the outer diameter surface.

5. The substrate support member of claim 1, wherein the inner portion of the stepped recess comprises a depression formed concentrically in the stepped recess of the quartz body.

6. A substrate support member for supporting a semiconductor substrate during processing, comprising:

a quartz body having:

an upper surface and a lower surface;

a stepped recess centrally formed in the upper surface having an outer portion and an inner portion;

at least one threaded hole formed between the upper and lower surface of the quartz body, the threaded hole having an outlet in the inner portion of the stepped recess;

a plurality of lift pin holes disposed through the quartz body and exiting the upper surface through the inner portion of the stepped recess;

a plurality of holes formed radially inward from an outer diameter surface of the quartz body; and a plurality of spring receiving holes formed through the quartz body respectively coupling each of the holes formed radially inward from the outer diameter surface and the stepped recess; and a plurality of ceramic rods configured to fit within the holes formed radially inward from the outer diameter surface of the quartz body.

7. The substrate support member of claim 6, further comprising a plurality of springs adapted to fit within the spring receiving hole and adapted to retain the ceramic rods within the holes formed radially inward from the outer diameter surface of the quartz body.

8. A substrate support member for supporting a semiconductor substrate during processing, comprising:

a quartz body having:

an upper surface and a lower surface;

a stepped recess centrally formed in the upper surface having an outer portion and an inner portion;

at least one threaded hole formed between the upper and lower surface of the quartz body, the hole having an outlet in the inner portion of the stepped recess;

a plurality of lift pin holes disposed through the quartz body and exiting the upper surface through the inner portion of the stepped recess;

a conductive lower shield fastened to the quartz body, the lower shield having a center portion and a lip, a first surface of the center portion disposed adjacent the lower surface and the lip disposed radially outward of the quartz body and projecting towards a plane defined by the first surface in a spaced-apart relation from the quartz body;

a plurality of ceramic rods extending radially inward from an outer diameter surface of the quartz body, wherein the quartz body further has a plurality of holes, for insertion of the plurality of ceramic rods, formed radially inward from the outer diameter surface of the quartz body; and a conductive insert disposed in the stepped recess formed in the upper surface of the quartz body.

9. The member of claim 8, wherein the conductive insert further comprises:

a boss extending from a side of the conductive insert and mating with a depression in the inner portion of the stepped recess formed in the quartz body.

10. The member of claim 8, wherein the conductive insert is titanium.

* * * * *

UNITED STATES PATENT AND TRADEMARK OFFICE
CERTIFICATE OF CORRECTION

PATENT NO. : 7,252,737 B2  Page 1 of 1
APPLICATION NO. : 10/819891
DATED : August 7, 2007
INVENTOR(S) : Karl Brown et al.

It is certified that error appears in the above-identified patent and that said Letters Patent is hereby corrected as shown below:

In the Detailed Description:

Column 6, line 36, please delete "259" and insert --289--

Signed and Sealed this

Tenth Day of June, 2008

JON W. DUDAS
*Director of the United States Patent and Trademark Office*